(12) United States Patent
Serras et al.

(10) Patent No.: US 6,872,879 B1
(45) Date of Patent: Mar. 29, 2005

(54) THERMOELECTRIC GENERATOR

(75) Inventors: Edouard Serras, 38 Bis Boulevard d'Argenson, 92200 Neuilly sur Seine (FR); Jean-Marie Gaillard, Limoges (FR); Patrick Flament, Auffargis (FR)

(73) Assignees: Edouard Serras, Neuilly sur Seine (FR); Institut Francais due Petrole, Rueil Malmaison Cedex (FR)

( * ) Notice: Subject to any disclaimer, the term of this patent is extended or adjusted under 35 U.S.C. 154(b) by 0 days.

(21) Appl. No.: 10/663,594

(22) Filed: Sep. 16, 2003

Related U.S. Application Data

(63) Continuation of application No. PCT/FR02/00918, filed on Mar. 14, 2002.

(30) Foreign Application Priority Data

Mar. 16, 2001 (FR) .............................................. 01 03719

(51) Int. Cl.[7] .......................... H01L 35/08; H01L 35/22
(52) U.S. Cl. ........................ 136/205; 136/211; 136/224; 136/225; 136/231; 136/236.1; 257/414; 257/467
(58) Field of Search ................................ 136/205, 211, 136/224, 225, 231, 236.1; 257/414, 467

(56) References Cited

U.S. PATENT DOCUMENTS

| | | | |
|---|---|---|---|
| 2,694,098 A | 11/1954 | Leins | |
| 3,424,890 A | 1/1969 | Ruyven | |
| 3,740,273 A | 6/1973 | Adler et al. | |
| 6,278,049 B1 * | 8/2001 | Johnson et al. | ............. 136/201 |

FOREIGN PATENT DOCUMENTS

| | | |
|---|---|---|
| DE | 297 23 309 U | 10/1998 |
| EP | 0 801 428 A1 | 10/1997 |
| JP | 2-21675 A * | 1/1990 |
| JP | 1-300574 A | 2/1990 |
| JP | 2-81462 A | 3/1990 |
| JP | 801428 A1 * | 10/1997 |

* cited by examiner

*Primary Examiner*—Alan Diamond
(74) *Attorney, Agent, or Firm*—Alston & Bird LLP

(57) ABSTRACT

A thermoelectric generator comprising a plurality of semiconductor elements of type n an type p alternatingly disposed and connected at the ends thereof to form a plurality of thermocouples on two opposite faces of the generator, said elements being thin polycrystalline semi-conductor ceramic layers deposited on a microporous support by means of serigraphy and fixed to said support by sintering.

7 Claims, 2 Drawing Sheets

THERMOELECTRIC GENERATOR

CROSS-REFERENCE TO RELATED APPLICATIONS

This application is a continuation of PCT Application No. PCT/FR02/00918, filed Mar. 14, 2002, which claims priority from French Application No. 0103719, filed Mar. 16, 2001, which is hereby incorporated herein in its entirety by reference.

The present invention relates to a semiconductor thermoelectric generator and to processes for manufacturing this generator.

It has been known for a long time to form thermocouples by joining together, at their ends, generally by soldering or welding, electrically conducting wires of two different types and to connect a large number of thermocouples in series, the junctions of which are alternately on one side of the set of wires and on the other. By heating the junctions located on one side and/or by cooling the junctions located on the other side, an electromotive force is generated at the terminals of the set of thermocouples, said electromotive force depending inter alia on the temperature difference between the hot junctions and the cold junctions and on the number of these junctions. The electrical power produced by this generator, for supplying a load, varies as the square of the electromotive force and as the inverse of the square of the internal resistance of the generator, that is to say of the electrical resistance of all of the thermocouples.

The heat flux passing through the generator from the hot junctions to the cold junctions will vary in magnitude according to the thermal conductivity of the thermocouples and that of the material that surrounds and protects them, to the associated surface areas for receiving or dissipating heat at the hot and cold junctions, etc. When it is desired to reduce this heat flux, to maintain a high temperature difference between the hot and cold junctions and to maintain or increase the useful electrical power produced, it may be unsatisfactory to reduce the cross section of the electrically conducting wires forming the thermocouples since this would result in an increase in the internal electrical resistance of the generator and in a reduction in the useful electrical power produced.

It has therefore been sought to use materials having a thermal conductivity lower than that of the metal wires of the thermocouples and in particular it has been proposed to replace them with p-type and n-type semiconductor elements that are connected together at their ends to form a set of series-connected thermocouples. These semiconductor thermocouples have a thermoelectric power markedly higher than that of electrically conducting metal wires, thereby making it possible for the efficiency and the useful electrical power of the generator to be increased quite substantially at the same temperature difference conditions between the hot and cold junctions.

However, most of the known semiconductor generators use components that are expensive and have not hitherto been able to be manufactured rapidly, reliably and economically.

Document EP-A-0 801 428 discloses a thermoelectric generator comprising thin films of semiconductor ceramics deposited on a dielectric substrate made of a ceramic, such as for example alumina, zirconia, magnesia or forsterite, having thermal conductivities of around 3 to 7 W/mK, it being possible for the substrate to be made of a metal. In such a generator, it is the substrate that determines the heat flux between the hot and cold junctions of the thermocouples, because of its large surface area for exchange with the hot source and with the cold source, these exchange surface areas being very much greater than those of the thin films of the thermocouples. Because of the relatively high thermal conductivities of the ceramics used for the substrate and its large surface areas for exchange with the hot and cold sources, the parasitic heat flux via the substrate between the hot and cold junctions of the thermocouples is high in the steady state, the temperature difference between these junctions becomes small and very much less than the temperature difference between hot and cold sources, and the electromotive force produced by the generator becomes very low and very much less than the anticipated value.

The object of the present invention is in particular to provide a simple, effective and inexpensive solution to these problems.

For this purpose, it proposes a semiconductor thermoelectric generator comprising a plurality of thin-film n-type and p-type semiconductor elements that are placed alternately on a dielectric substrate made of a ceramic and are connected in pairs at their ends to form a plurality of thermocouples on two opposed faces of the generator, characterized in that said elements are polycrystalline semiconductor ceramics and in that the dielectric substrate is thermally insulating and made of a ceramic with a microporous structure.

The generator according to the invention offers a number of advantages over the prior art:

- the thermocouples are made of a semiconductor material and have a thermoelectric power very much higher than that of thermocouples made of electrically conducting metal wires;
- the semiconductor elements of the generator are thin films and may be of short length, thereby making it possible to miniaturize the generator according to the invention;
- the semiconductor elements are inexpensive polycrystalline ceramics, their costs being generally less than those of metals and their processing employing inexpensive techniques, for example screen printing, strip casting, impregnation, etc.;
- the thermal conductivity of these polycrystalline semiconductor ceramics is very much lower than that of metals; and
- the ceramic substrate with a microporous structure has a very low thermal conductivity, of less than 0.5 W/mK.

This substrate is compatible with the semiconductor elements used, and its low thermal conductivity ensures that a maximum temperature difference is maintained between the hot and cold junctions in the steady state.

Several generators according to the invention may be connected in series and/or in parallel in order to supply a given load. For example, a generator may be formed from a plurality of the aforementioned substrates carrying polycrystalline ceramic semiconductor elements, the semiconductor elements of one substrate being connected together in series and being connected in series or in parallel to the semiconductor elements of another substrate.

These substrates may, for example, be in the form of cylinders, strips, washers or half-washers. They may be flat or have curved shapes.

The invention also proposes a process for manufacturing a thermoelectric generator of the aforementioned type, this process being characterized in that it consists in depositing thin films of semiconductor ceramics on a dielectric substrate made of a microporous ceramic and then in sintering the semiconductor ceramics by raising the temperature, in order to fix them to the substrate.

Advantageously, in a first method of implementation, this process consists in forming the aforementioned thin films by deposition on the substrate by screen printing, from suspensions of semiconductor ceramic powder in a liquid.

This deposition by screen printing is rapid and relatively precise, and well suited to inexpensive mass production.

The sintering is then carried out conventionally, by passing into a furnace.

In an alternative method of implementation, this process consists in depositing semiconductor ceramic powders on the dielectric substrate, in using a controlled scanning laser beam, so as simultaneously to fix features made of semiconductor ceramics to the substrate and to sinter the semiconductor ceramics, and then to remove the excess semiconductor ceramic powders from the substrate.

The process may be carried out in this way for depositing and sintering the n-type semiconductor ceramics and repeated in order to deposit and to sinter the p-type semiconductor ceramics.

In another alternative method of implementing the invention, the dielectric substrate is a textile web impregnated with a dielectric ceramic suspension, on which web thin-film polycrystalline semiconductor ceramic features are deposited by screen printing, after which the web is wound up on itself and the wound web is placed in a furnace in order to sinter the ceramics and burn off the textile web so as to give the ceramic substrate a porous structure.

Advantageously, after the web has been wound up and before passing into a furnace, electrical connections are formed on an end face of the wound web, between ends of features formed from semiconductor ceramics, these connections being made by depositing conducting materials such as conducting inks or pastes, or by means of metal brazes.

As a variant, it is possible to form a sheet of dielectric ceramic by casting and then to deposit films of polycrystalline semiconductor ceramics on this sheet by screen printing.

In another variant, the thin films of polycrystalline semiconductor ceramics are formed on the dielectric substrate by means that are used conventionally for the fabrication of electronic circuits, such as for example CVD (chemical vapor deposition).

In general, the invention makes it possible to produce thermoelectric generators that are capable of delivering relatively high levels of useful electrical power, that can be used with extreme temperatures and can be achieved inexpensively by the use of simple, rapid and economical techniques.

The invention will be more clearly understood and other characteristics, details and advantages thereof will become more clearly apparent on reading the description that follows, given by way of example with reference to the appended drawings in which.

Figures 1, 2:
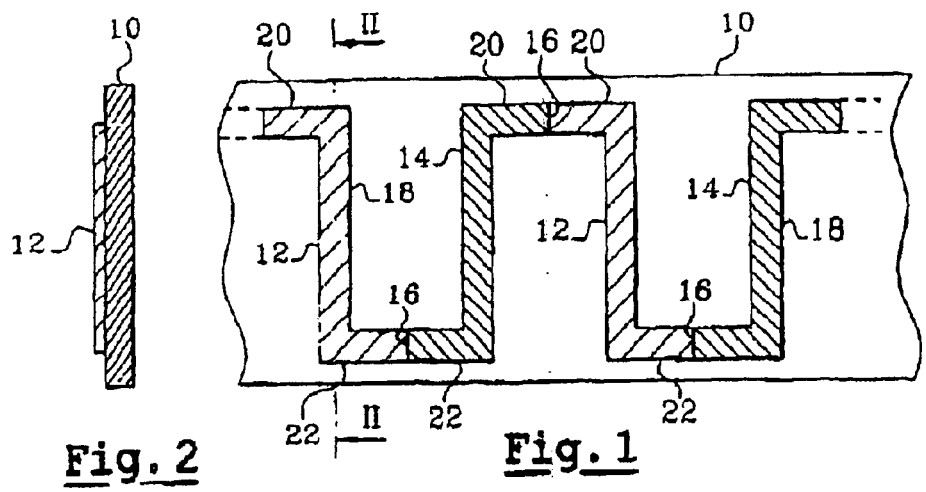
FIG. 1 is a partial schematic view, on a large scale, of one element of a generator according to the invention.
FIG. 2 is a sectional view on the line II—II of FIG. 1.

Referring firstly to FIGS. 1 and 2, these show one component of a thermoelectric generator according to the invention, this component comprising a substrate 10 made of thermally insulating dielectric such as, preferably, a ceramic wafer having a microporous structure, one face of which carries n-type and p-type semiconductor elements 12, 14 respectively, these being placed alternately and connected in series to one another in order to form thermocouples at their junctions 16.

In the example shown, each element 12, 14 comprises a straight bar 18, that extends transversely to the longitudinal direction of the substrate 10, and two perpendicular bars 20, 22 at its ends, these two bars being oriented in opposite directions to each other.

Each element 12, 14 could, of course, have a different shape, provided that it extends from one transverse edge of the substrate 10 to the other. These elements 12, 14 are thin films of, respectively, n-type doped and p-type doped polycrystalline semiconductor ceramics that are, for example, deposited by screen printing on the substrate 10 and are then subjected to a sintering heat treatment, for consolidating them and fixing them to the substrate 10.

Typically, the semiconductor elements 12, 14 have a thickness of less than 2 mm, for example between 0.04 and 1 or 2 mm, and relatively variable lengths, for example from a few millimeters to a few centimeters.

The junctions 16 that are formed between the semiconductor elements 12, 14 alternate from one side of the longitudinal mid-axis of the substrate 10 to the other, to form the respective hot and cold junctions of the thermocouples.

To form these semiconductor elements 12, 14, all types of ceramic may be used, that is to say all materials that are not metals or organic compounds, these materials especially comprising oxides, carbides, nitrides, borides, silicides, etc., as well as all mineral compounds.

These ceramics are suitably doped to form the semiconductor elements 12, 14 in a manner known to those skilled in the art. For example, it is possible to use iron oxides doped with nickel, with germanium, with zirconium, etc., chromium oxides doped with iron, tin oxides, iron silicides, molybdenum silicides, silicon or tungsten carbides, titanates, etc.

Costs of all these materials are in general less than those of metals.

The substrate 10 can be made of all-ceramic microporous dielectric, for example of the type used for the fabrication of hybrid electronic circuits, that is to say made of sintered alumina or of aluminum nitride for example, or else made of steatite, cordierite, porcelain, etc., which are less expensive and have dielectric properties that are inferior to those of sintered alumina or of aluminum nitride, but nevertheless sufficient for the voltages produced in a thermoelectric generator.

The microporous structure of the ceramic of the substrate 10 very greatly reduces the thermal conductivity of the substrate and reduces the conductive heat flux between the hot side and the cold side of the generator. The Ecole Nationale Supérieure de Céramique Industrielle at Limoges (France) has in particular developed ceramics having pore or capillary sizes of around 0.01–1 $\mu$m, the pores occupying about 70 to 80% of the volume of the ceramic. Such ceramics have thermal conductivities of around 0.01 to 0.2 W/mK. If, for example, a microporous ceramic having a thermal conductivity of around 0.03 W/mK is used as substrate for the semiconductor films, the parasitic heat flux passing via the substrate is reduced by a factor of at least 100 compared with the exemplary embodiments disclosed in the aforementioned document EP-A0 801 428. This means inter alia that:

to obtain the same electromotive force as in the prior document, the substrate of the generator according to the invention may have a thickness 100 times smaller, thereby allowing miniaturization of the generator; and for the same substrate thickness, the parasitic heat flux reduced by a factor of 100, the electromotive force produced is increased considerably and it is possible to dispense with having to mount heat sinks or other heat exchangers on the hot and cold sides of the generator.

The invention therefore specified, for being used as the substrate, ceramics that have a thermal conductivity of less than 0.5 W/mK and preferably less than or equal to about 0.2 W/mK. To improve the mechanical properties, these ceramics may have a granular (two-phase) composite structure or a composite structure based on fibers. In addition, the ceramics of the substrate 10 and of the semiconductor elements 12, 14 must be compatible so that their adhesion is sufficient and a chemical diffusion between them is low. Of course, it is possible to provide a diffusion barrier, for example made of zirconia or zircon, between the substrate 10 and the semiconductor elements 12, 14 in order to avoid any risk of diffusion.

Moreover, the materials of the substrate and of the semiconductor elements will be chosen so as to preferably have substantially identical or similar thermal expansion coefficients so as to avoid high thermal stresses in the components of the generator during its use.

The polycrystalline semiconductor ceramics used to form the elements 12, 14 provide the advantage of having an electrical resistivity that decreases with temperature. Owing to this characteristic, the internal electrical resistance of the generator according to the invention may be relatively low at high temperature.

Figure 3:
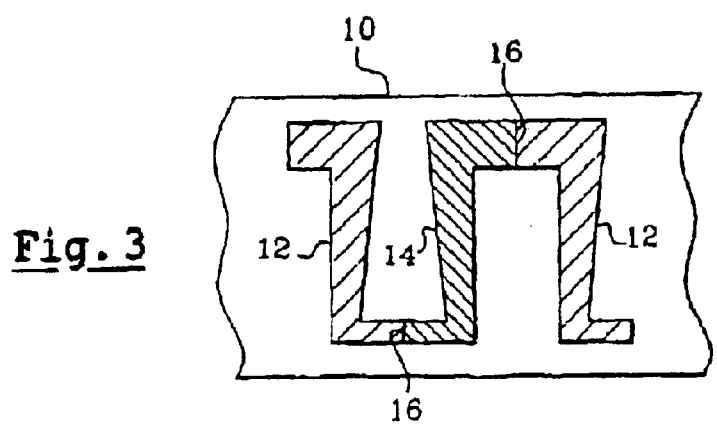
FIG. 3 is a view corresponding to FIG. 1 and shows an alternative embodiment.

Moreover, and as shown schematically in FIG. 3, it is possible to give the semiconductor elements 12, 14 a geometry that counterbalances the influence of the increase in electrical resistivity at low temperature, by increasing the cross section of the semiconductor elements 12, 14 on the cold junction side, that is to say on the same side as the upper edge of the substrate 10 in FIG. 3.

Figures 4, 5:
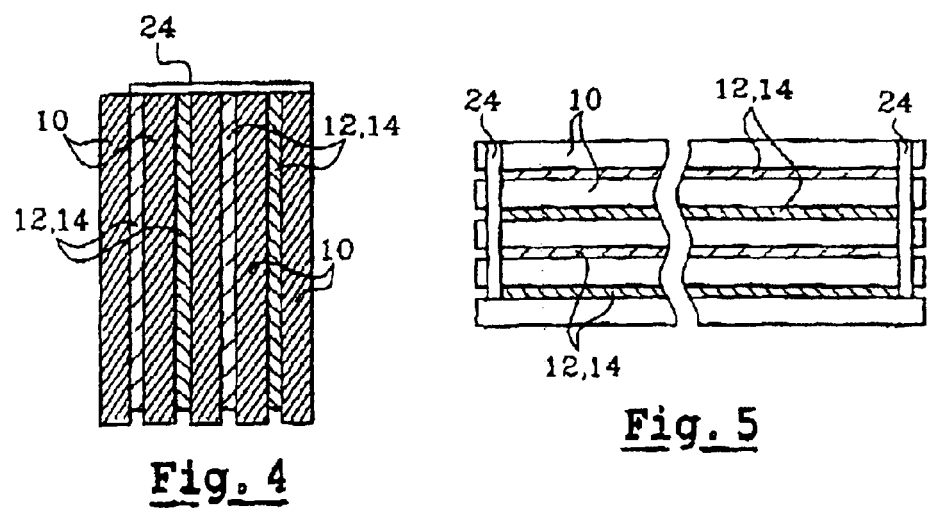
FIG. 4 is a schematic cross-sectional view of a generator according to the invention.
FIG. 5 is a top view of the generator of FIG. 4.

FIGS. 4 and 5 are schematic views of a generator comprising several components of the types shown in FIGS. 1 to 3, these components being stacked in such a way that the semiconductor elements 12, 14 carried by a substrate 10 are covered by another substrate 10 of the same type and of the same size. The number of substrates 10 is one greater than that of the components, so that the semiconductor elements of all the components are covered by a dielectric substrate 10.

When this stack is produced, electrical connections may be formed between the semiconductor elements of the various components. In particular, as shown in FIGS. 4 and 5, when all the semiconductor elements of a component are connected together in series, it is possible to connect the semiconductor elements of the various components in parallel by means of two connecting bands 24 of electrically conducting material, which bands are placed on the end face of the stack having the cold junctions and are in contact with the latter at one end of the set of semiconductor elements carried by each component and at the other end thereof.

These connecting bands 24 are formed, for example, by depositing, by screen printing, an electrically conducting ink such as a silver lacquer, or by a metal braze.

These connecting bands may be extended to form terminals for connection to an electrical circuit.

As indicated above, the components of a thermoelectric generator are formed by depositing, by screen printing, the semiconductor elements 12, 14 on a substrate 10 made of a dielectric ceramic, and then by sintering.

Figure 6:
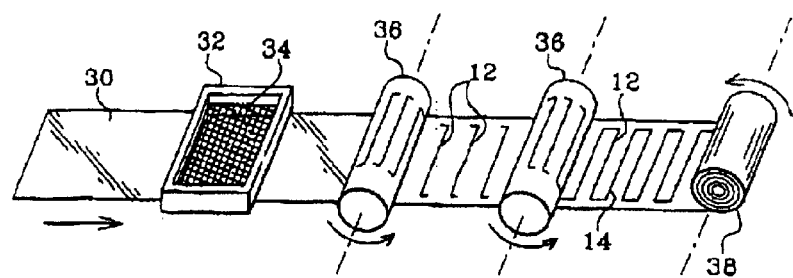
FIG. 6 illustrates schematically a process for manufacturing a generator according to the invention.

Another manufacturing process is illustrated schematically in FIG. 6.

This process consists essentially in impregnating a textile web 30, of any type, with a dielectric ceramic suspension (called a slip) by making the textile web 30 pass through a vessel or a tank 32 containing a dielectric ceramic suspension 34, the slip-impregnated textile web that leaves the tank 32 possibly being partly dried in order to have a plastic consistency. Features made of polycrystalline semiconductor ceramics are then formed by screen printing on the upper face of the textile web 30, by means of rotary screens 36. To do this, screen-printing inks containing a suspension of powdered polycrystalline semiconductor ceramics are used.

A first rotary screen 36 is used to form the n-type semiconductor elements 12 on the upper face of the textile web 30 and then a second rotary screen 36 is used to form the p-type semiconductor elements 14 on this textile web 30, the elements 12, 14 being joined together at their ends to form the aforementioned junctions.

Connecting bands may also be formed by screen printing on the web 30 on the cold junctions side. Next, the web 30 is wound up on itself as shown at 38. Connecting bands, in parallel, of various sets of semiconductor elements may then be formed on that end face of the reel that has the cold junctions, by depositing a conducting ink or by a metal braze.

The wound web is then placed in a furnace for the sintering. During this sintering, the textile web 30 is burnt off and the thermal resistance of the dielectric layer is improved by the creation of pores corresponding to the volume occupied by the textile yarns. The generator thus obtained then has a cylindrical general shape.

As a variant, a strip of dielectric may be formed by a casting technique. After partial drying, the semiconductor elements are deposited on this strip by screen printing, by means of flat screens.

Figure 7:
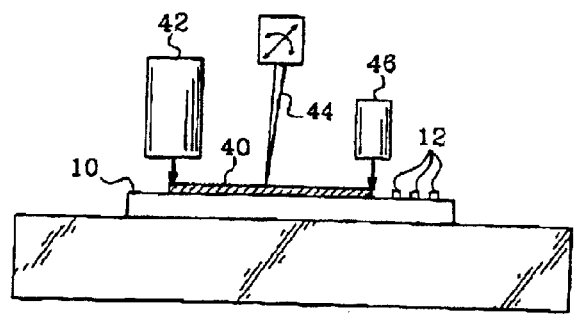
FIG. 7 shows schematically another production process.

FIG. 7 shows schematically another process for manufacturing a generator according to the invention, which involves a technique disclosed in document WO 99/29519. This technique consists in depositing a layer 40 of a powdered polycrystalline semiconductor ceramic on a substrate 10 made of dielectric ceramic, by means of a suitable device 42, then in forming, on the substrate 10, a feature corresponding to the aforementioned semiconductor elements 12 (or 14) and in simultaneously sintering this feature by means of a laser beam 44, the scanning of which can be performed at a relatively high rate along two perpendicular axes. Next, a suitable device 46 allows the excess semiconductor powder to be removed, leaving the aforementioned semiconductor elements 12 (or 14) on the surface of the substrate 10. This process is therefore carried out once with the n-type semiconductor ceramic powder and once with the p-type semiconductor ceramic powder.

It is also possible to use conventional processes for fabricating hybrid electronic components, such as CVD (chemical vapor deposition) to form the thin semiconductor films on the substrate 10.

What is claimed is:

1. A thermoelectric generator comprising a plurality of thin-film n-type and p-type semiconductor elements that are placed alternately on a dielectric substrate and are connected in pairs at their ends to form a plurality of thermocouples, wherein said elements are polycrystalline semiconductor ceramics and the dielectric substrate is made of a microporous ceramic and has a thermal conductivity of less than 0.5 W/mK.

2. The generator as claimed in claim 1, wherein the semiconductor ceramics have thicknesses of less than 2 mm.

3. The generator as claimed in claim 1, wherein the semiconductor ceramics are sintered on the substrate.

4. The generator as claimed in claim 1, wherein the semiconductor elements placed on the substrate are connected in series and/or in parallel.

5. The generator as claimed in claim 1, and comprising a plurality of superposed substrates carrying the semiconductor elements, the semiconductor elements of a substrate being connected together in series and being connected in series or in parallel to the semiconductor elements of another substrate.

6. The generator as claimed in claim 5, wherein the substrates are in the form of strips, cylinders, washers or half-washers.

7. The generator as claimed in claim 2 wherein the semiconductor ceramics have a thickness greater than 0.04 mm and lower than 2 mm.

* * * * *